(12) United States Patent
Doyle et al.

(10) Patent No.: US 8,519,510 B2
(45) Date of Patent: Aug. 27, 2013

(54) SEMICONDUCTOR STRUCTURE HAVING AN INTEGRATED QUADRUPLE-WALL CAPACITOR FOR EMBEDDED DYNAMIC RANDOM ACCESS MEMORY (EDRAM) AND METHOD TO FORM THE SAME

(75) Inventors: Brian S. Doyle, Portland, OR (US); Uday Shah, Portland, OR (US); Satyarth Suri, Hillsboro, OR (US); Ramanan V. Chebiam, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 13/165,615

(22) Filed: Jun. 21, 2011

(65) Prior Publication Data
US 2012/0326274 A1 Dec. 27, 2012

(51) Int. Cl.
*H01L 29/92* (2006.01)

(52) U.S. Cl.
USPC .......... 257/534; 257/532; 257/E29.343; 257/E21.09

(58) Field of Classification Search
USPC .......... 257/534, 532, E29.343, E21.09
See application file for complete search history.

(56) References Cited

U.S. PATENT DOCUMENTS

| 7,525,143 B2 | 4/2009 | Chae |
| 2010/0079924 A1 | 4/2010 | Keating et al. |

*Primary Examiner* — Long Pham
(74) *Attorney, Agent, or Firm* — Blakely Sokoloff Taylor Zafman LLP

(57) ABSTRACT

Semiconductor structures having integrated quadruple-wall capacitors for eDRAM and methods to form the same are described. For example, an embedded quadruple-wall capacitor includes a trench disposed in a first dielectric layer disposed above a substrate. The trench has a bottom and sidewalls. A quadruple arrangement of metal plates is disposed at the bottom of the trench, spaced apart from the sidewalls. A second dielectric layer is disposed on and conformal with the sidewalls of the trench and the quadruple arrangement of metal plates. A top metal plate layer is disposed on and conformal with the second dielectric layer.

15 Claims, 9 Drawing Sheets

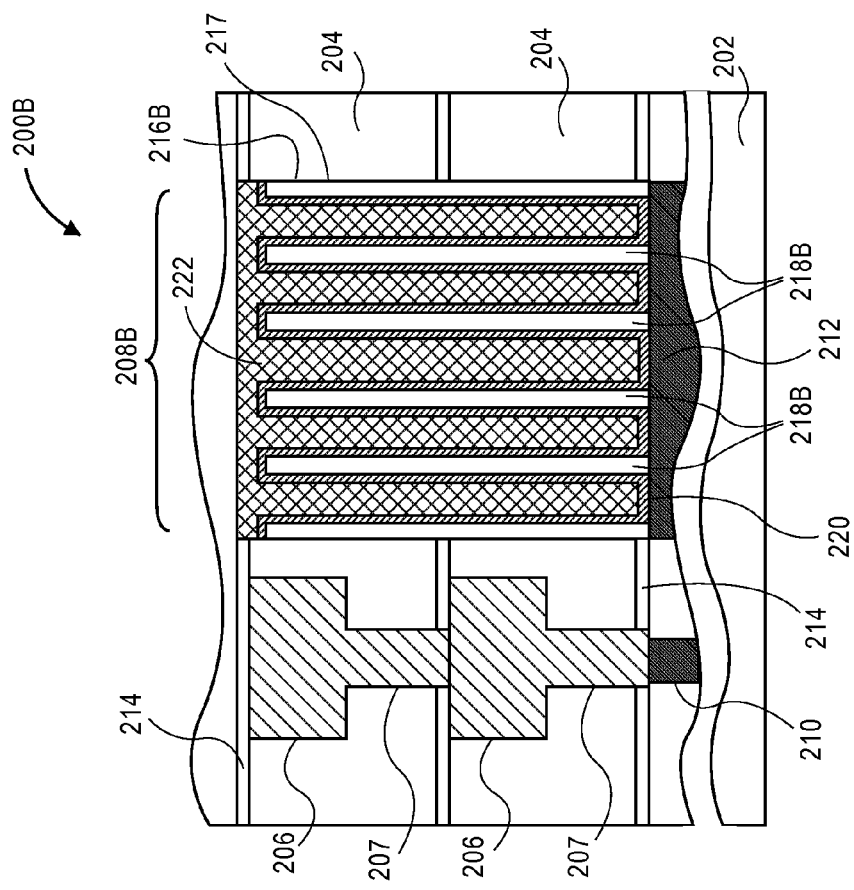
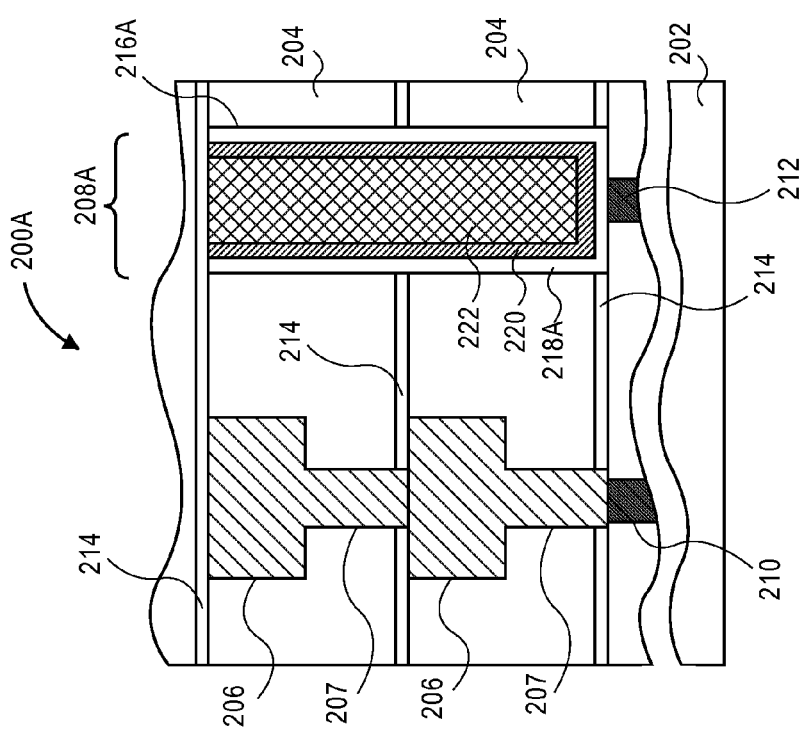

SEMICONDUCTOR STRUCTURE HAVING AN INTEGRATED QUADRUPLE-WALL CAPACITOR FOR EMBEDDED DYNAMIC RANDOM ACCESS MEMORY (EDRAM) AND METHOD TO FORM THE SAME

TECHNICAL FIELD

Embodiments of the invention are in the field of dynamic random access memory and, in particular, semiconductor structures having integrated quadruple-wall capacitors for eDRAM and methods to form the same.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issues. The necessity to optimize the performance of each device becomes increasingly significant.

In semiconductor devices such as DRAMs (Dynamic Random Access Memory), each cell is composed of one transistor and one capacitor. In DRAMs, cells require periodic reading and refreshing. Owing to the advantages of low price-per-unit-bit, high integration, and ability to simultaneously perform read and write operations, DRAMs have enjoyed widespread use in commercial applications. The ability to easily detect the '1' and '0' states of the memory depends to a large extent on the size of the capacitor in the DRAM cell. Larger capacitors allow easier signal detection. Also, since DRAM's are volatile, they require constant refreshing. The frequency of refresh is also reduced as the capacitance increases. Furthermore, a phenomenon referred to as "soft error" can be caused in DRAM devices by a loss of charge that was stored in a capacitor due to external factors, thereby causing malfunction of DRAMs. In order to prevent the occurrence of soft error, a method of enhancing the capacitance of a capacitor has been suggested. However, challenges are presented in formulating practical manufacturing processes due to the ever increasing high level of integration of semiconductor devices.

Furthermore, metal lines are typically integrated in layers separate from capacitor layers. In an example, a copper metal layer is formed above a group of capacitors and is not run in the same layer as the capacitors. FIG. 1 represents such an example where vias of metal lines are formed through capacitor dielectric layers to connect the upper metal line layers to lower device layers. Specifically, FIG. 1 is a cross-sectional view of a capacitor formed in a dielectric layer distinct from a dielectric layer used to house metal wiring, in accordance with the prior art.

Referring to FIG. 1, a first interlayer insulating layer 103 is formed on a semiconductor substrate 101 having a cell array region 102. The first interlayer insulating layer 103 is patterned to form contact holes exposing the semiconductor substrate 101 on the cell array region 102 and the contact holes are filled with a conductive material to form a lower electrode contact plug 105A. An etch stop layer 107 and a second interlayer insulating layer 109 are sequentially formed on the resulting structure.

The second interlayer insulating layer 109 and the etch stop layer 107 are sequentially etched in the cell array region 102 to form the lower electrode contact plug 105A and a storage node hole 111 exposing the first interlayer insulating layer 103 around the lower electrode contact plug. After a material layer for a lower electrode is conformally deposited on the resulting structure, a planarization process is carried out to form the lower electrode 113 covering a bottom and an inner sidewall of the storage node hole 111. A dielectric layer 115 and an upper electrode layer 117 are sequentially deposited and patterned on the semiconductor substrate 101. A via 124 of a metal line 122 is formed through capacitor dielectric layers (e.g., dielectric layer 109, and even inter-layer dielectric layer 120) to connect the upper metal line 122 layer to the semiconductor substrate 101 having the cell array region 102.

BRIEF DESCRIPTION OF THE DRAWINGS

FIG. 2A illustrates a cross-sectional view of a single-wall capacitor formed in dielectric layers housing metal wiring.

FIG. 2B illustrates a cross-sectional view of a quadruple-wall capacitor formed in dielectric layers housing metal wiring, in accordance with an embodiment of the present invention.

DETAILED DESCRIPTION

Figure 1:
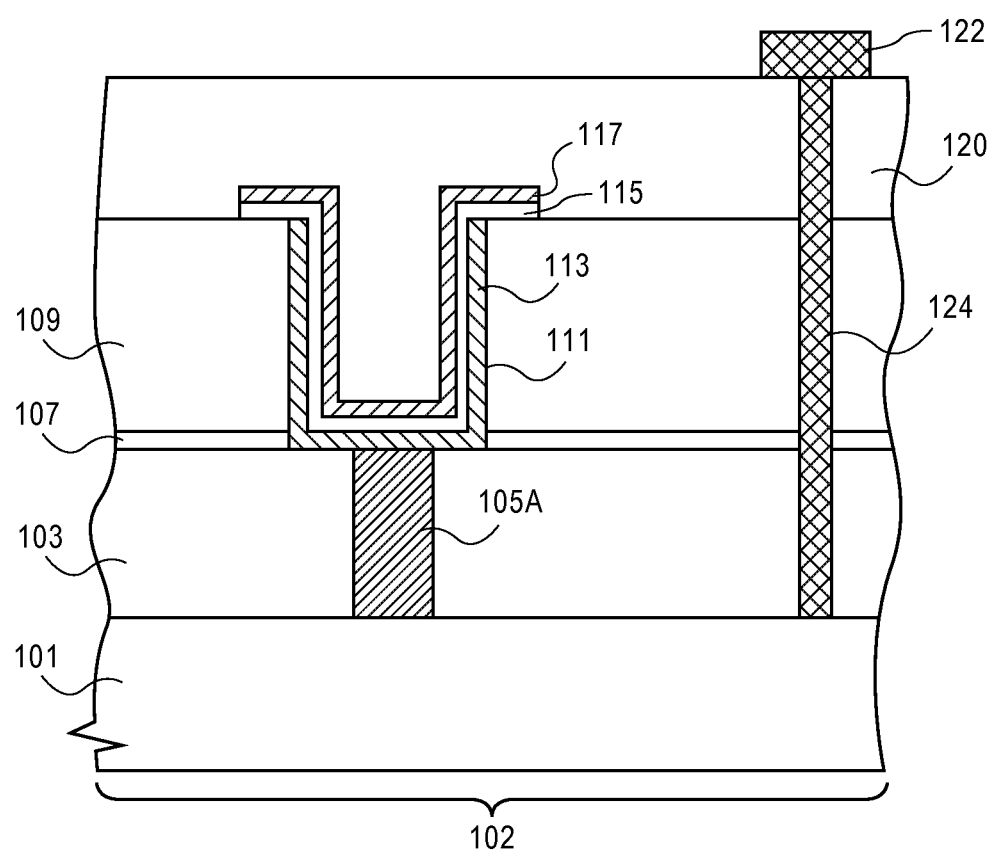
FIG. 1 is a cross-sectional view of a capacitor formed in a dielectric layer distinct from a dielectric layer used to house metal wiring, in accordance with the prior art.

Semiconductor structures having integrated quadruple-wall capacitors for eDRAM and methods to form the same are described. In the following description, numerous specific details are set forth, such as specific metal wiring layer counts and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Conventional approaches to incorporating capacitor structures with metal wiring layers only introduces metal wirings, such as copper lines, after and above the capacitor layers. In such arrangements, the metal wiring layers do not share dielectric layers with the dielectric layers used to house the capacitor structures. Furthermore, in the conventional architectures, methods are available for increasing the height of the lower electrode as a method for increasing the surface area of the lower electrode to increase capacitance. In one such method, the height of a dielectric layer where the lower electrode is positioned is increased. However, if the height is increased, the process burden is also increased because large amount of etching is required when the metal contact hole is formed. Furthermore, since the metal wiring is not housed in the dielectric layer, such an approach creates an even greater distance between metal wiring layers and respective device layers.

Additionally, scaling while maintaining constant capacitance may require that the capacitor occupy many levels of interconnect. Building such a capacitor may pose significant processing problems both from the etch and the fill points of view since the aspect ratio of these holes increases as the size of the capacitor hole decreases.

There may also be capacitance limitations with the sizing of a capacitor formed in a logic semiconductor process. For example, the capacitance of a singe-wall embedded capacitor may be limited if only formed in a few layers of back-end dielectric layers. The capacitance may be increased by vertically increasing the size of the singe-wall embedded capacitor, but processing realities may pose issues with doing so. In another vein, increasing the number of walls of the embedded capacitor in the horizontal direction can provide an overall increased capacitance. In accordance with an embodiment of the present invention, a quadruple-wall capacitor is provided as integrated into a logic fabrication process.

In accordance with an embodiment of the present invention, a quadruple-wall capacitor structure, e.g., for an embedded dynamic random access memory (DRAM) product, is incorporated with metal wiring layers to share one or more dielectric layers housing the metal wiring layers. For example, in one embodiment, the height of the capacitor structure is essentially the height of two metal wiring dielectric layers, and the capacitor structure is formed adjacent to the two metal wiring layers. In another embodiment, the height of the capacitor structure is essentially the height of only one metal wiring dielectric layer, and the capacitor structure is formed adjacent to the one metal wiring layer. However, the capacitor height may need to be the height of 2 or more dielectric layers in order to supply enough capacitance. The capacitor structure may be formed in the metal wiring dielectric layer(s) after formatting of the metal wiring layers. Such an approach allows embedding of a DRAM capacitor into a logic (CPU) process. By contrast, conventional approaches of including even a single-wall capacitor structure start with a DRAM process and add logic capability later to fabricate embedded DRAM.

The embedded DRAM described herein may be included on a first chip and packaged with a microprocessor on a second chip. Alternatively, the embedded DRAM described herein may be included on the same chip as a microprocessor to provide a monolithic fabrication process. In an embodiment, from a top-down perspective, a quadruple-wall capacitor has a shape such as, but not limited to, a circular shape, a square shape, an oval shape, a rectangular shape, a square shape having rounded corners, or a rectangular shape having rounded corners.

Disclosed herein are semiconductor structures having integrated quadruple-wall capacitors for eDRAM. In one embodiment, an embedded quadruple-wall capacitor includes a trench disposed in a first dielectric layer disposed above a substrate. The trench has a bottom and sidewalls. A quadruple arrangement of metal plates is disposed at the bottom of the trench, spaced apart from the sidewalls. A second dielectric layer is disposed on and conformal with the sidewalls of the trench and the quadruple arrangement of metal plates. A top metal plate layer is disposed on and conformal with the second dielectric layer.

Also disclosed herein are methods of fabricating semiconductor structures having integrated quadruple-wall capacitors for eDRAM. In one embodiment, a method includes etching a trench in a first dielectric layer formed above a substrate. The trench has a bottom and sidewalls. A quadruple arrangement of metal plates is formed at the bottom of the trench, spaced apart from the sidewalls. A second dielectric layer is deposited on and conformal with the sidewalls of the trench and the quadruple arrangement of metal plates. A top metal plate layer is deposited on and conformal with the second dielectric layer.

In an aspect of the present invention, an embedded quadruple-wall capacitor is included in one or more same dielectric layers as metal wiring. For comparison, FIG. 2A illustrates a cross-sectional view of a single-wall capacitor formed in dielectric layers housing metal wiring. As an example, FIG. 2B illustrates a cross-sectional view of a quadruple-wall capacitor formed in dielectric layers housing metal wiring, in accordance with an embodiment of the present invention.

Referring to FIGS. 2A and 2B, a semiconductor structure 200A or 200B, respectively, includes a plurality of semiconductor devices disposed in or above a substrate 202. One or more dielectric layers 204 is/are disposed above the plurality of semiconductor devices in or above the substrate 202. Metal wiring 206, such as copper metal wiring, is disposed in each of the dielectric layers 204. Metal wiring 206 is electrically coupled to one or more of the semiconductor devices in or above the substrate 202. A single-wall or quadruple-wall capacitor 208A or 208B, respectively, is disposed in at least one of the dielectric layers 204. The single-wall or quadruple-wall capacitor 208A or 208B is adjacent to the metal wiring 206 of at least one of the dielectric layers 204 and is electrically coupled to one or more of the semiconductor devices in or above the substrate 202.

It is to be understood that metal wiring 206 refers to metal lines, e.g., used as interconnect lines. Metal wiring 206 is to be distinguished from vias, e.g., vias 207, which may also be housed in dielectric layer(s) 204 and used to couple metal wirings 206 in different dielectric layers 204 or to couple a metal wiring with some other electrical contact, e.g., contacts 210. Contact 210 may represent another via, another metal wiring, or an actual contact structure formed between a via 207 and a semiconductor device. Single-wall or quadruple-wall capacitor 208A or 208B may be electrically coupled to one or more of the semiconductor devices in or above the substrate 202 through with some electrical contact, e.g., contacts 212. In one embodiment, contact 212 is composed of copper. Contact 212 may represent another via, another metal wiring, or an actual contact structure formed between the bottom of single-wall or quadruple-wall capacitor 208A or 208B and a semiconductor device. In an embodiment, at least a portion of the metal wiring 206 is electrically coupled to one or more semiconductor devices included in a logic circuit, and the single-wall or quadruple-wall capacitor 208A or 208B is an embedded dynamic random access memory (eDRAM) capacitor. The top electrode of the single-wall or quadruple-wall capacitor may be connected by a via from an interconnect or metal wiring layer above the single-wall or quadruple-wall capacitor. In one embodiment, such a connection provides the common or ground connection of the eDRAM.

Referring to both FIGS. 2A and 2B, in one embodiment, the single-wall or quadruple-wall capacitor 208A or 208B is disposed in two of the dielectric layers 204. In that embodiment, the single-wall or quadruple-wall capacitor 208A or 208B is adjacent to the metal wiring 206 of each of the two dielectric layers 204 and also adjacent to a via 207 coupling the metal wiring 206 of each of the two dielectric layers 204. In other embodiments, a single-wall or quadruple-wall capacitor 208A or 208B is disposed in only one, or in more than two, of the dielectric layers and is adjacent to the metal wiring of all of the only one or more than two dielectric layers. In one embodiment, although not depicted, the footprint of the single-wall and the quadruple-wall capacitor 208A and 208B, respectively, is the same.

Referring again to FIGS. 2A and 2B, semiconductor structures 200A and 200B, respectively, further include one or more etch-stop layers 214, such as a silicon nitride, silicon oxide, or silicon oxy-nitride etch-stop layer. For example, an etch-stop layer may be disposed between each of the dielectric layers 204, and directly below the dielectric layer closest to the substrate 202, as depicted in FIGS. 2A and 2B. In an embodiment, the single-wall or quadruple-wall capacitor 208A or 208B is disposed in a trench 216A or 216B, respectively, disposed in at least one of the dielectric layers 204. It is to be understood that reference to a trench may also include a dielectric or a conductive liner layer, such as layer 217 depicted in FIG. 2B. Reference to layers formed on the sidewall of the trench may include embodiments wherein a layer is formed on such a dielectric or conductive liner layer.

The single-wall capacitor 208A includes a U-shaped metal plate 218. Referring to FIG. 2A the single-wall capacitor 208A is disposed along the bottom and sidewalls of the trench 216A. By contrast, however, referring to FIG. 2B, the quadruple-wall capacitor 208B includes a quadruple arrangement of metal plates 218B disposed along the bottom but inset from the sidewalls of the trench 216B. A capacitor dielectric layer 220 is disposed on and conformal with the U-shaped metal plate 218A or the quadruple arrangement of metal plates 218B and, in the case of FIG. 2B, conformal with the exposed sidewalls or liner of trench 216B. A trench-fill metal plate 222 is disposed on the second dielectric layer 220. Although not depicted in FIGS. 2A and 2B, the trench-fill metal plate 222 may include a first conformal conductive layer and a second fill metal layer. The second dielectric layer 220 insulates the trench-fill metal plate 222 from the U-shaped metal plate 218A or the quadruple arrangement of metal plates 218B.

In an embodiment, the trench-fill metal plate 222 is composed mostly of copper, e.g., a copper fill formed on a conformal titanium nitride layer. In an embodiment, the U-shaped metal plate 218A or the quadruple arrangement of metal plates 218B is composed of a tantalum nitride layer, a titanium nitride layer, a titanium layer, a tantalum layer or a ruthenium layer. In an embodiment, one or more of the conductive layers of the trench-fill metal plate 222, the U-shaped metal plate 218A, or the quadruple arrangement of metal plates 218B is formed by a technique such as, but not limited to, an electro-chemical deposition process, an electro-less deposition process, a chemical vapor deposition process, an atomic layer deposition (ALD) process, or a reflow process. It is to be understood that silver, aluminum, or an alloy of copper, silver or aluminum may be used in place of the above described copper. General metal wiring layers and corresponding via layers described herein as being formed from copper may also instead be formed from, in some embodiments, silver, aluminum, or an alloy of copper, silver or aluminum. In an embodiment, the U-shaped metal plate 218A or the quadruple arrangement of metal plates 218B is electrically coupled to an underlying semiconductor device by a floor metal layer, e.g., contact 212, which may be a contact or additional metal wiring layer. In one embodiment, an additional conductive protection layer is disposed on the floor metal layer (not shown in FIG. 2B), as described in more details below in association with FIG. 3B.

In an embodiment, the sidewalls of the trench for a quadruple-wall capacitor include a vertical or near-vertical profile, e.g., the vertical or near-vertical profile of the trench 216B depicted in FIG. 2B. In another embodiment, however, the sidewalls of the trench taper outward from the bottom of at least one of the dielectric layers 204 to the top of at least one of the dielectric layers 204 (not shown). In comparison with 2A, the capacitance of the capacitor of 2B is increased without having to make the capacitor taller.

In an embodiment, at least one of the dielectric layers 204 is a low-K dielectric layer (a layer with a dielectric constant less than 4 for silicon dioxide). In one embodiment, at least one of the dielectric layers 204 is formed by a process such as, but not limited to, a spin-on process, a chemical vapor deposition process, or a polymer-based chemical vapor deposition process. In a specific embodiment, at least one of the dielectric layers 204 is formed by a chemical vapor deposition process involving silane or an organo-silane as a precursor gas. In an embodiment, at least one of the dielectric layers 204 is composed of a material that does not significantly contribute to leakage current between a series of metal interconnects subsequently formed in or on at least one of the dielectric layers 204. In one embodiment, at least one of the dielectric layers 204 is composed of a material in the range of 2.5 to less than 4. In a particular embodiment, at least one of the dielectric layers 204 is composed of a material such as, but not limited to, a silicate or a carbon-doped oxide with 0-10% porosity. In another embodiment, however, at least one of the dielectric layers 204 is composed of silicon dioxide.

In an embodiment, the capacitor dielectric layer 220 is composed a high-K dielectric layer (a layer with a dielectric constant greater than 4 for silicon dioxide). In one embodiment, the capacitor dielectric layer 220 is formed by an atomic vapor deposition process or a chemical vapor deposition process and is composed of a material such as, but not limited to, silicon oxy-nitride, hafnium oxide, zirconium oxide, hafnium silicate, hafnium oxy-nitride, titanium oxide, or lanthanum oxide. In another embodiment, however, the capacitor dielectric layer 220 is composed of silicon dioxide.

In an embodiment, substrate 202 is composed of a material suitable for semiconductor device fabrication. In one embodiment, substrate 202 is a bulk substrate composed of a single crystal of a material which may include, but is not limited to, silicon, germanium, silicon-germanium or a III-V compound semiconductor material. In another embodiment, substrate 202 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 202 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 202 may further include dopant impurity atoms.

In accordance with an embodiment of the present invention, substrate 202 has thereon or therein an array of complimentary metal-oxide-semiconductor (CMOS) transistors fabricated in a silicon substrate and encased in a dielectric layer. A plurality of metal interconnects may be formed above the transistors, and on a surrounding dielectric layer, and are used to electrically connect the transistors to form an integrated circuit. In one embodiment, the integrated circuit is used for a DRAM.

Thus, referring to FIG. 2B, in accordance with an embodiment of the present invention, an embedded quadruple-wall capacitor 208B for a semiconductor device includes a trench 216B disposed in a first dielectric layer 204 disposed above a substrate 202. The trench 216B has a bottom and sidewalls. A quadruple arrangement of metal plates 218B is disposed at the bottom of the trench 216B, spaced apart from the sidewalls. A second dielectric layer 220 is disposed on and conformal with the sidewalls of the trench 216B and the quadruple arrangement of metal plates 218B. A top metal plate layer 222 is disposed on and conformal with the second dielectric layer 220.

In one embodiment, the quadruple arrangement of metal plates 218B is electrically coupled, through a floor metal layer 212 disposed below the first dielectric layer 204, to an underlying transistor (not shown) disposed above the substrate 202, the transistor included in a dynamic random access memory (DRAM) circuit. In a specific such embodiment, the capacitor 208B further includes a conductive protection layer (not shown) disposed directly between the quadruple arrangement of metal plates 218B and the floor metal layer 212. In a particular such embodiment, the quadruple arrangement of metal plates 218B and the top metal plate layer 222 each include a layer of titanium nitride, the floor metal layer 212 is composed of copper, and the conductive protection layer is composed of cobalt or tantalum.

In one embodiment, the top metal plate layer 222 is composed of a first conductive layer (not shown) and a conductive trench-fill layer (shown as 222 in FIG. 2B). In a specific such embodiment, the first conductive layer is composed of titanium nitride, tantalum nitride, titanium, tantalum or ruthenium, and the conductive trench-fill layer is composed of copper. In an embodiment, the first dielectric layer 204 is a low-K dielectric layer, and the second dielectric layer 220 is a high-K dielectric layer.

In an aspect of the present invention, a semiconductor processing scheme may be used to fabricate a quadruple-wall embedded capacitor structure. For example, FIGS. 3A-3M illustrate cross-sectional views representing operations in a method of forming a semiconductor structure having an embedded quadruple-wall capacitor, in accordance with an embodiment of the present invention.

Figure 3A:
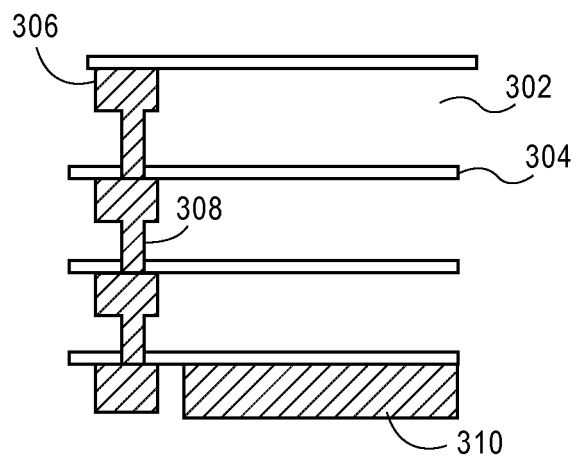
FIGS. 3A-3M illustrate cross-sectional views representing operations in a method of forming a semiconductor structure having an embedded quadruple-wall capacitor, in accordance with an embodiment of the present invention.

Referring to FIG. 3A, a semiconductor stack, such as a logic stack, includes a plurality of alternating dielectric layers 302 and etch stop layers 304. A plurality of metal wirings 306 and corresponding vias 308 (e.g., copper metal wirings and vias) are formed in the stack of alternating dielectric layers 302 and etch stop layers 304. A floor metal layer 310 (such as a via) that will ultimately serve as a floor metal layer of the quadruple-wall capacitor, such as a copper floor metal layer, is also included.

Figure 3B:
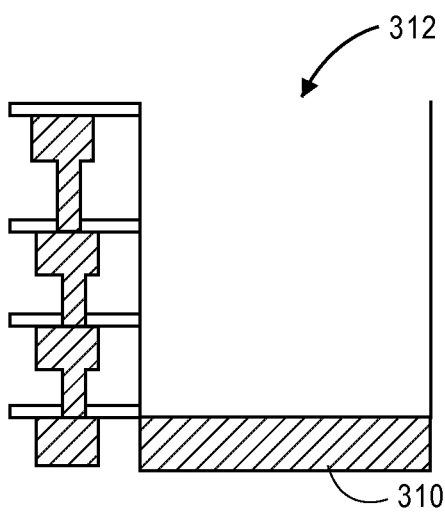

Referring to FIG. 3B, a trench 312 is formed in the plurality of alternating dielectric layers 302 and etch stop layers 304 and adjacent to metal wirings 306 and corresponding vias 308. A portion of the etch stop layer 304 previously covering floor metal layer 310 is removed to expose floor metal layer 310. In an embodiment, a special reverse plate mask is used to define a future eDRAM area, e.g., for etching out the future location of a quadruple-wall capacitor. It is to be understood that although three metal wiring and corresponding via layers are depicted above floor metal layer 310, more than or less than three such layers may also be used for ultimate formation of a quadruple-wall capacitor therein.

Figure 3C:
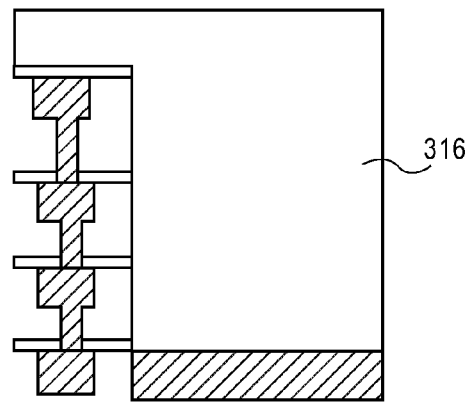
Figure 3D:
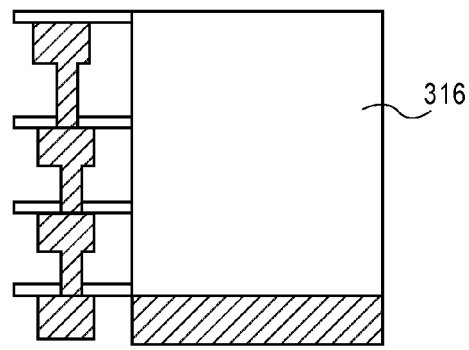

In an embodiment, a logic isolation layer may then deposited or formed in trench 312, but is not shown. Such a logic isolation layer may temporarily cover floor metal layer 310. Referring to FIG. 3C, a dummy inter-layer dielectric film 316 is formed in trench 312. In an embodiment, dummy inter-layer dielectric film 316 is composed of a material suitable for later selective removal with respect to dielectric layers 302 and etch stop layers 304. In one such embodiment, dummy inter-layer dielectric film 316 is composed of a carbon spin-on material which can be ashed. The dummy inter-layer dielectric film 316 is then polished and etched to provide a planar surface, as depicted in FIG. 3D.

Figure 3E:
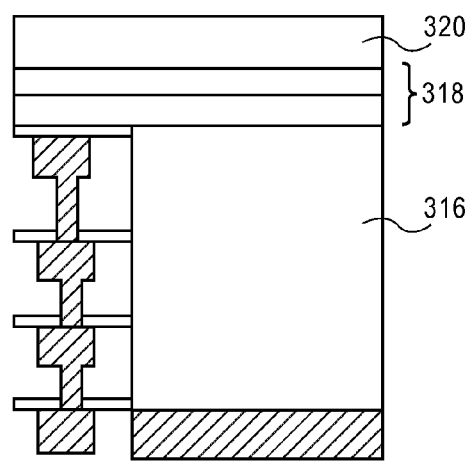
Figure 3F:
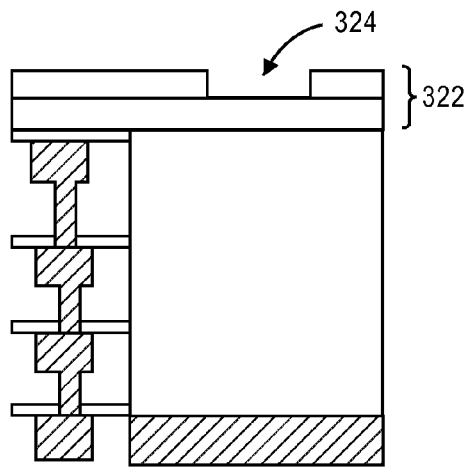
Figure 3G:
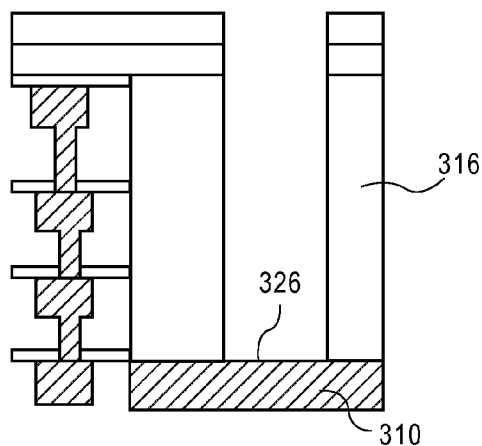

Referring to FIG. 3E, a hardmask stack 318 and a resist layer 320 are deposited above the planarized dummy inter-layer dielectric film 316. In one embodiment, the hardmask stack 318 is composed of a bottom layer of titanium nitride with a thickness approximately in the range of 20-50 nanometers and a top layer of silicon oxide with a thickness approximately in the range of 15-35 nanometers. The resist layer 320 is then patterned, the top layer of the hardmask stack 318 etched to receive the pattern of the patterned resist, and the resist subsequently ashed to provide a partially patterned hardmask stack 322 with an opening 324, as depicted in FIG. 3F. Referring to FIG. 3G, the bottom layer of the partially patterned hardmask stack 322 and the dummy inter-layer dielectric film 316 are then etched to receive the pattern of the partially patterned hardmask stack 322.

Figure 3H:
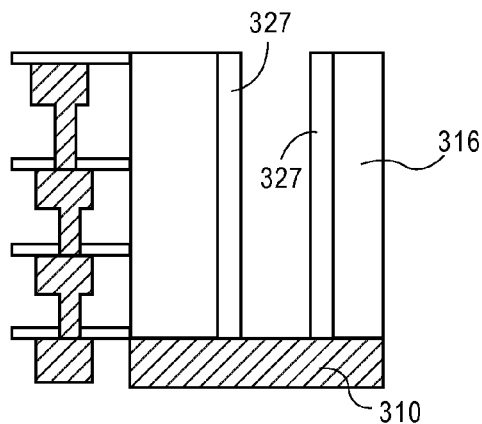

The remainder of hardmask stack 318 is then removed to re-expose dummy inter-layer dielectric film 316, as depicted in FIG. 3H. Also referring to FIG. 3H, a backbone structure 327 is formed along the sidewalls of dummy inter-layer dielectric film 316. In an embodiment, the backbone structure 327 is a removable dielectric backbone with sidewalls on which are eventually deposited the first (lower) metal electrode of a quadruple-wall capacitor. In one embodiment, the use of the backbone structure 327 thus effectively doubles the surface area of the first metal plate of a capacitor structure, giving a doubling of the capacitance over a double-wall approach or a quadrupling of the capacitance over a single-wall approach. In one embodiment, the backbone structure 327 is formed by a blanket deposition and subsequent etch process, to effectively form etched spacers along the sidewalls of dummy inter-layer dielectric film 316.

Figure 3I:
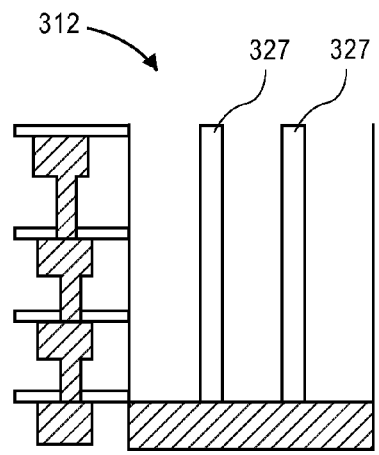
Figure 3J:
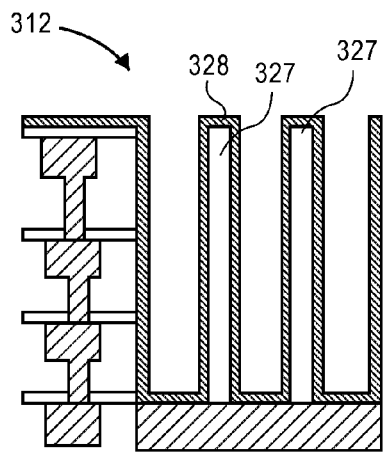
Figure 3K:
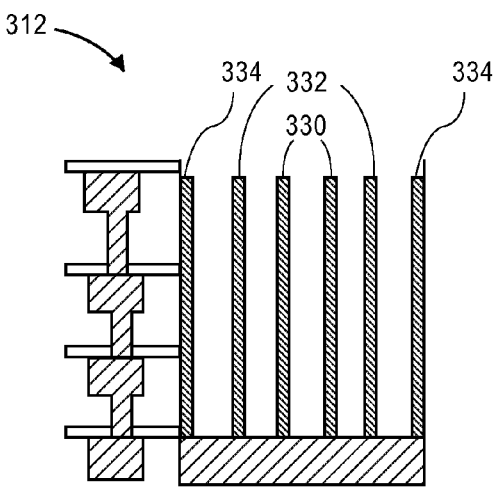

Referring to FIG. 3I, all remaining portions of the dummy inter-layer dielectric film 316 are removed, e.g., by a wet etch or dry etch process, or by ashing. The removal re-exposes trench 312 but leaves standing backbone structure 327. A quadruple plate-forming layer 328 is then formed conformal with the trench 312 and with the backbone structure 327, as depicted in FIG. 3J. In one embodiment, the quadruple plate-forming layer 328 is formed by atomic layer deposition (ALD) and is composed of titanium nitride. Referring to FIG. 3K, the quadruple plate-forming layer 328 is patterned to form a quadruple arrangement of metal plates. The quadruple arrangement of metal plates includes inner plates 330 and outer plates 332. Additionally, following the patterning of the quadruple plate-forming layer 328 to form a quadruple arrangement of metal plates, the backbone structure 327 is removed, as is also depicted in FIG. 3K.

In an embodiment, a timed etch is used to pattern the quadruple plate-forming layer to form the quadruple arrangement of metal plates. However, in an embodiment, e.g., if a timed etch is not sufficiently controlled, a spin-on dielectric layer (e.g., a SLAM layer) is used to protect at least a portion of the quadruple plate-forming layer 328 for at least a portion of the duration used to form the quadruple arrangement of metal plates. In one embodiment, the top of the plate-forming layers is polished off. As an artifact of patterning the quadruple plate-forming layer 328, sidewall liners 334 may also remain in trench 312. In an embodiment, the removal of the backbone structure 327 is performed by using a selective dielectric layer etch process.

Figure 3L:
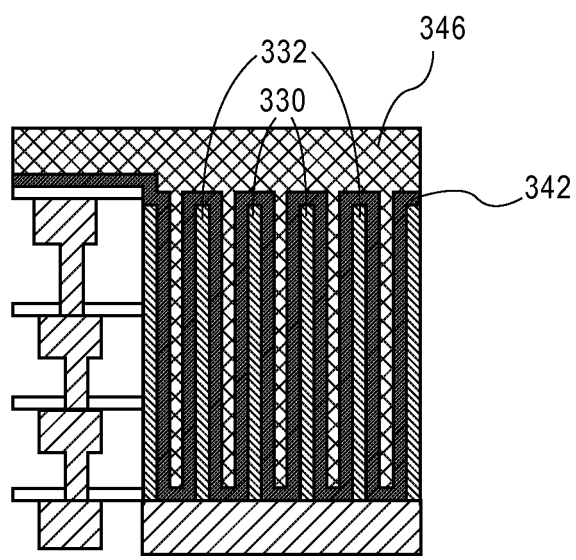
Figure 3M:
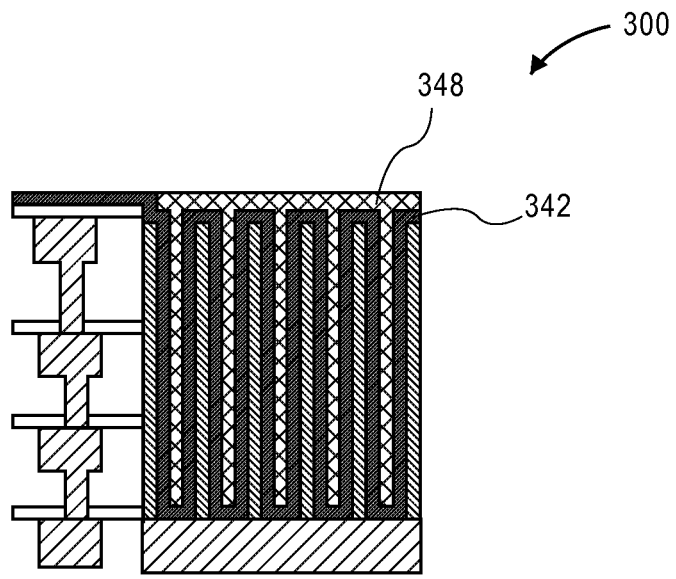

Referring to FIG. 3L, a capacitor dielectric layer 342 is then formed conformal with the inner plates 330 and outer plates 332 of the quadruple arrangement of metal plates. In one embodiment, the capacitor dielectric layer 342 is formed by atomic layer deposition (ALD) and is composed of a high-k dielectric material. Referring again to FIG. 3L, a conductive trench-fill material 346 is then formed on the capacitor dielectric layer 342. The conductive trench-fill material 346 may ultimately be used to form a top plate of a capacitor structure. Alternatively, in one embodiment (although not shown), a first layer 344 of a top plate, is formed to ultimately reside between the conductive trench-fill material 346 and the capacitor dielectric layer 342. In one embodiment, the conductive trench-fill material 346 is composed of copper, a first layer of a top plate is formed conformal with the capacitor dielectric layer 342 by atomic layer deposition (ALD) and is composed of titanium nitride. Referring to FIG. 3M, a quadruple-wall capacitor structure 300 is provided by planarizing the conductive trench-fill material 346 to form a trench-fill portion 348 of the top metal plate, or to form the top plate itself.

In another aspect of the present invention, a conductive protection layer is deposited directly on floor metal layer 310 prior to formation of the quadruple-wall capacitor, although not shown in FIGS. 3A-3M. In one embodiment, the conductive protection layer is composed of tantalum. In one embodiment, the conductive protection layer protects floor metal layer 310 from later processing such as atomic layer deposition (ALD) including chlorine-containing species. A conductive protection layer may be particularly useful if the underlying or floor metal structure (such as an underlying via structure) is composed of copper. In one such embodiment, fabrication of the quadruple-wall capacitor includes use of a conductive protection layer to prevent an underlying copper via from being corroded during an inner metal ALD deposition. In a specific embodiment, in the case that tungsten is used to form the underlying floor metal, a conductive protection layer may not be needed.

In a specific aspect of the present invention, an embedded quadruple-wall capacitor, such as one of the capacitors described above, is included in the dielectric layer of specific metal wiring layer(s). For example, FIG. 4 illustrates a cross-sectional view of a quadruple-wall capacitor formed in the two dielectric layers housing third-level and fourth-level metal wiring, in accordance with an embodiment of the present invention.

Figure 4:
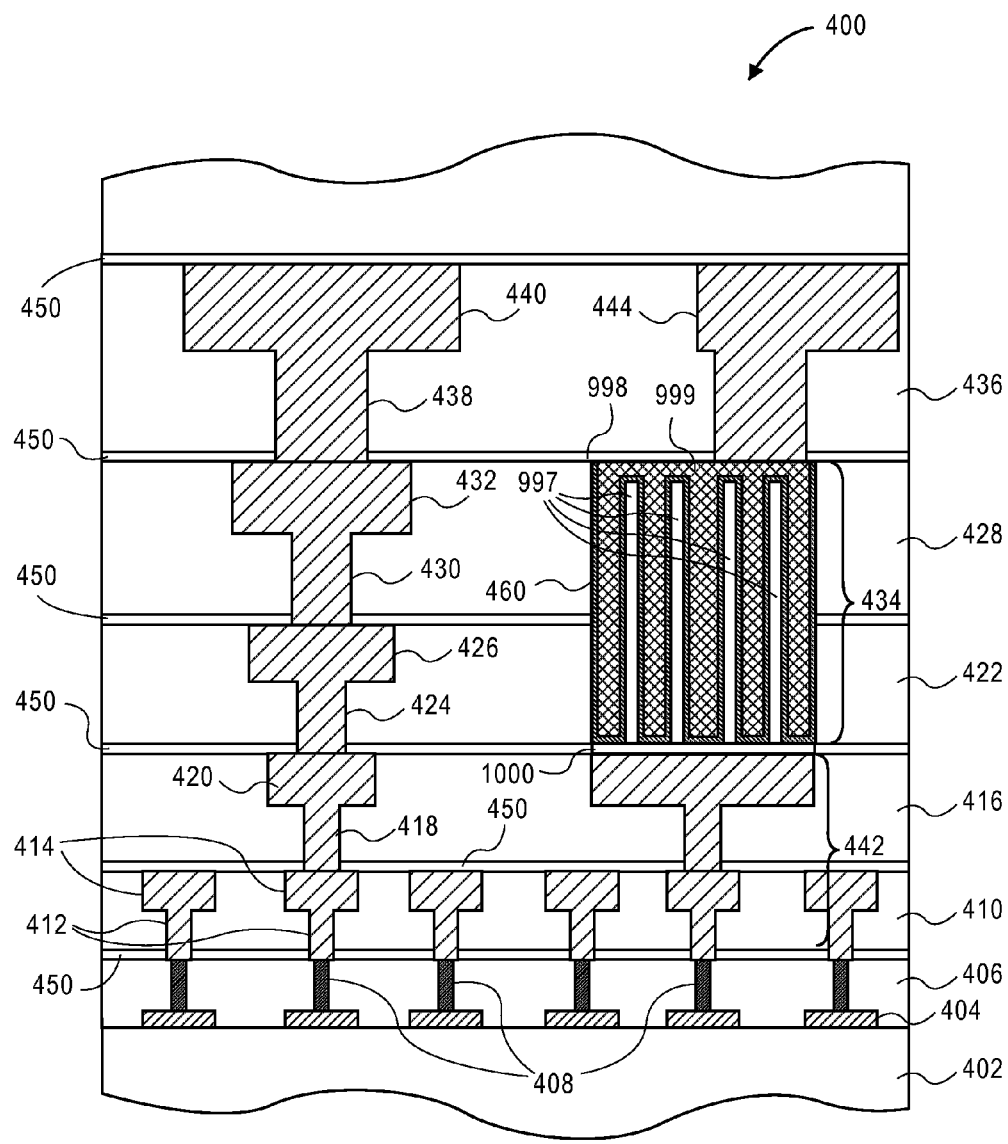
FIG. 4 illustrates a cross-sectional view of a quadruple-wall capacitor formed in the two dielectric layers housing third-level and fourth-level metal wiring, in accordance with an embodiment of the present invention.

Referring to FIG. 4, a semiconductor structure 400 includes a plurality of semiconductor devices 404 disposed in or above a substrate 402. A first dielectric layer 406 is disposed above the plurality of semiconductor devices 404 and has disposed therein contacts 408 electrically coupled to the plurality of semiconductor devices 404.

A second dielectric layer 410 is disposed above the first dielectric layer 406 and has disposed therein a first metal wiring 414 and one or more vias 412 coupling the first metal wiring 414 to the contacts 408. A third dielectric layer 416 is disposed above the second dielectric layer 410 and has disposed therein a second metal wiring 420 and one or more vias 418 coupling the second metal wiring 420 to the first metal wiring 414. A fourth dielectric layer 422 is disposed above the third dielectric layer 416 and has disposed therein a third metal wiring 426 and one or more vias 424 coupling the third metal wiring 426 to the second metal wiring 420. A fifth dielectric layer 428 is disposed above the fourth dielectric layer 422 and has disposed therein a fourth metal wiring 432 and one or more vias 430 coupling the fourth metal wiring 432 to the third metal wiring 426.

Fifth dielectric layer 428 also has disposed therein at least a portion of a quadruple-wall capacitor 434. The quadruple-wall capacitor 434 is adjacent to the fourth metal wiring 432. The quadruple-wall capacitor 434 is electrically coupled to one or more of the semiconductor devices 404, e.g., by a stack 442 of metal wirings and vias and through to a contact 408. A sixth dielectric layer 436 is disposed above the fifth dielectric layer 428 and has disposed therein a fifth metal wiring 440 and one or more vias 438 coupling the fifth metal wiring 440 to the fourth metal wiring 432. In an embodiment, another portion of the quadruple-wall capacitor 434 is disposed in the fourth dielectric layer 422, adjacent to the third metal wiring 426, but no portion of the quadruple-wall capacitor 434 is disposed in the third or the sixth dielectric layers 416 or 436, respectively, as is depicted in FIG. 4. As is also depicted in FIG. 4, a metal wiring 444 may be disposed above the quadruple-wall capacitor 434, but need not be coupled with the quadruple-wall capacitor 434.

In an embodiment, at least a portion of the fourth metal wiring 432 is electrically coupled to one or more semiconductor devices 408 included in a logic circuit, and the quadruple-wall capacitor 434 is an embedded dynamic random access memory (eDRAM) capacitor. In an embodiment, semiconductor structure 400 further includes a plurality of etch-stop layers 450. As shown, an etch-stop layer may be disposed between each of the first (406), second (410), third (416), fourth (422), fifth (428) and sixth (436) dielectric layers.

In an embodiment, the quadruple-wall capacitor 434 is disposed in a trench 460 disposed in at least the fifth dielectric layer 428. In one such embodiment, the quadruple-wall capacitor 434 includes a quadruple arrangement of metal plates 997 disposed along the bottom but inset from the sidewalls of the trench 460. A seventh dielectric layer 998 is disposed on and conformal with the quadruple arrangement of metal plates 997 and the sidewalls of the trench 460. It is to be understood that, although not shown, an additional benign conductive layer may be disposed along the sidewalls of the trench 460 as an artifact from processing (in that case, since the conductive layer is benign, the seventh dielectric layer 998 would still be described as being disposed on and conformal with the sidewalls of the trench 460). A trench-fill metal plate 999 is disposed on the seventh dielectric layer 998 and although not depicted as such, may include multiple conductive layers. The seventh dielectric layer 998 isolates the trench-fill metal plate 999 from the quadruple arrangement of metal plates 997. In a specific embodiment, the sidewalls of the trench have a vertical or near-vertical profile, as is depicted for trench 460 of FIG. 4. In an alternative specific embodiment, however, the sidewalls of the trench taper outward from the bottom to the top of the fifth dielectric layer 428.

In an embodiment, the second (410), third (416), fourth (422), fifth (428) and sixth (436) dielectric layers are low-K dielectric layers, and the seventh dielectric layer 998 is a high-K dielectric layer. Other materials or structural details for the features of semiconductor structure 400 of FIG. 4 may be such as described above for semiconductor structures 200B and 300. In an embodiment, a conductive protection layer 1000 is disposed between the quadruple arrangement of metal plates 997 and the stack 442 of metal wirings and vias disposed from the quadruple-wall capacitor 434 and through to a contact 408, as depicted in FIG. 4.

It is to be understood that, in other embodiments, additional single or multiple layers of dielectric layers and/or metal lines may be formed below or above quadruple-wall capacitor 434. Also, in other embodiments, single or multiple layers of dielectric layers and/or metal lines may be removed from below or above quadruple-wall capacitor 434. In other embodiments, quadruple-wall capacitor 434 is formed in an additional one or more layers of dielectric layers. In one exemplary embodiment, in reference to FIG. 4 (although not shown), another portion of the quadruple-wall capacitor 434 is disposed in both the fourth 422 and sixth 436 dielectric layers, adjacent to the third 426 and fifth 440 metal wirings. In one such embodiment, however, no portion of the quadruple-wall capacitor is disposed in the third dielectric layer 416.

Figure 5:
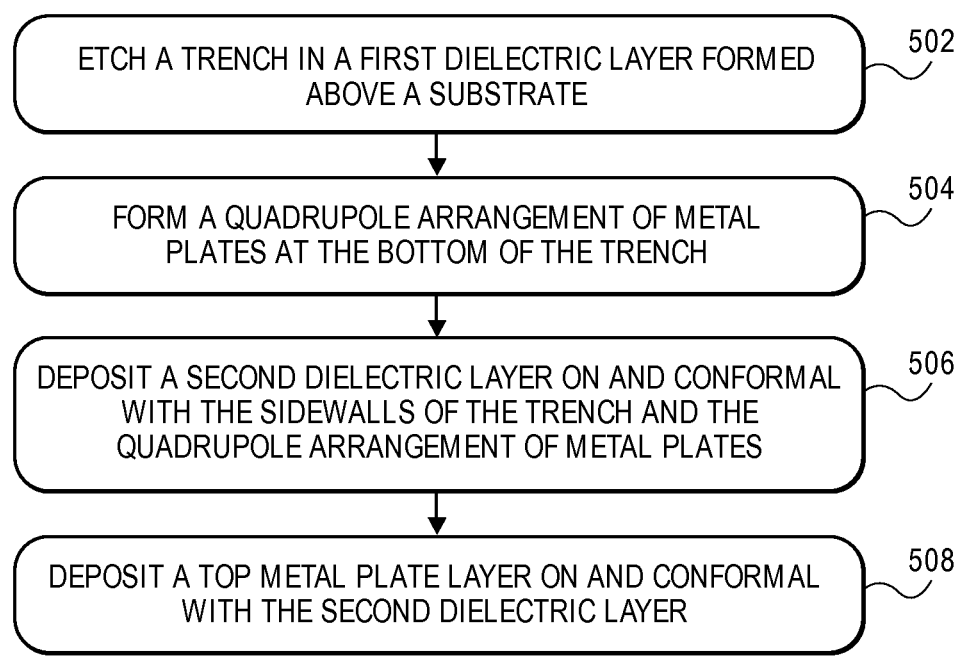
FIG. 5 is a Flowchart representing operations in a method of forming a semiconductor structure having an embedded quadruple-wall capacitor, in accordance with an embodiment of the present invention.

In another aspect of the present invention, a method of fabricating an embedded quadruple-wall capacitor for semiconductor devices is provided. FIG. 5 is a Flowchart 500 representing operations in a method of forming a semiconductor structure having an embedded quadruple-wall capacitor, in accordance with an embodiment of the present invention.

Referring to operation 502 of Flowchart 500, a trench is etched in a first dielectric layer formed above a substrate. The trench has a bottom and sidewalls.

In an embodiment, forming the first dielectric layer includes forming a low-K dielectric layer, and etching to form the trench includes etching the low-K dielectric layer. In one such embodiment, etching to form the trench also includes terminating the etch process on a corresponding etch-stop layer. In an embodiment, the trench is formed to have sidewalls with a vertical or near-vertical profile, as depicted above in FIG. 2B. In an alternative embodiment, however, the trench is formed to have sidewalls which taper outward from the bottom of the trench to the top of the trench.

Referring to operation 504 of Flowchart 500, a quadruple arrangement of metal plates is formed at the bottom of the trench, spaced apart from the sidewalls.

In an embodiment, prior to forming the first dielectric layer and etching the trench of operation 502, a floor metal layer is formed. Then, a conductive protection layer is formed on the floor metal layer. In that embodiment, forming the quadruple arrangement of metal plates at the bottom of the trench includes disposing the quadruple arrangement of metal plates on the conductive protection layer. In one such embodiment, the quadruple arrangement of metal plates is formed from a titanium nitride layer, the floor metal layer is formed from a copper layer, and the conductive protection layer is formed from a cobalt layer or from a tantalum layer.

Referring to operation 506 of Flowchart 500, a second dielectric layer is deposited on and conformal with the sidewalls of the trench and the quadruple arrangement of metal plates.

In an embodiment, depositing the second dielectric layer includes forming a high-K dielectric layer. In an embodiment, the second dielectric layer is deposited using an atomic layer deposition (ALD) process.

Referring to operation 508 of Flowchart 500, a top metal plate layer is deposited on and conformal with the second dielectric layer.

In an embodiment, the top metal plate layer is deposited by forming a titanium nitride layer. In an embodiment, depositing the top metal plate layer includes forming a first conductive layer and then forming a conductive trench-fill layer on the first conductive layer. In one such embodiment, forming the first conductive layer includes forming a titanium nitride layer, and forming the conductive trench-fill layer includes forming a copper layer. In an embodiment, the top metal plate layer is deposited using an atomic layer deposition (ALD) process.

In an embodiment, forming the embedded quadruple-wall capacitor includes electrically coupling the embedded quadruple-wall capacitor to one or more semiconductor devices. In one such embodiment, the embedded quadruple-wall capacitor is formed in the same one or more dielectric layers in a semiconductor structure housing metal wiring. The metal wiring may be coupled to one or more semiconductor devices included in a logic circuit. In an embodiment, forming the embedded quadruple-wall capacitor provides an embedded dynamic random access memory (eDRAM) capacitor.

In accordance with an embodiment of the present invention, forming the quadruple-wall capacitor includes forming the quadruple-wall capacitor in only one dielectric layer. In another embodiment, forming the quadruple-wall capacitor includes forming the quadruple-wall capacitor in only two dielectric layers, adjacent to the metal wiring of each of the two dielectric layers and also adjacent to a via coupling the metal wiring of each of the two dielectric layers. In one such embodiment, the method further includes, subsequent to forming the first of the two of the dielectric layers and prior to forming the second of the two of the dielectric layers and the quadruple-wall capacitor, forming an etch-stop layer on the first of the two of the dielectric layers. The etch-stop layer is then patterned to open a region for subsequently forming the quadruple-wall capacitor. The second of the two of the dielectric layers is formed on the patterned etch-stop layer and in the region. In yet another embodiment, forming the quadruple-wall capacitor includes forming the quadruple-wall capacitor in more than two dielectric layers, adjacent to the metal wiring of all of the more than two dielectric layers.

In an embodiment, a method of fabricating a semiconductor structure having a quadruple-wall capacitor and metal wiring integrated in a same dielectric layer further includes forming one or more etch-stop layers, including forming an etch-stop layer between each of the dielectric layers, and directly below the dielectric layer closest to the substrate. In an embodiment, forming the one or more dielectric layers includes forming one or more low-K dielectric layers. Other materials or structural details for the features of the fabricated semiconductor structure may be such as described above for semiconductor structures 200B, 300 and 400.

Thus, semiconductor structures having integrated quadruple-wall capacitors for eDRAM and methods to form the same have been disclosed. In an embodiment, a semiconductor structure includes a plurality of semiconductor devices disposed in or above a substrate. One or more dielectric layers are disposed above the plurality of semiconductor devices. Metal wiring is disposed in each of the dielectric layers and electrically coupled to one or more of the semiconductor devices. An embedded quadruple-wall capacitor is disposed in one or more of the dielectric layers and adjacent to the metal wiring of the one or more dielectric layers. The embedded quadruple-wall capacitor includes a trench disposed in the one or more of the dielectric layers, the trench having a bottom and sidewalls. A quadruple arrangement of metal plates is disposed at the bottom of the trench, spaced apart from the sidewalls. An insulator layer is disposed on and conformal with the sidewalls of the trench and the quadruple arrangement of metal plates. A top metal plate layer is disposed on and conformal with the insulator layer. In one embodiment, at least a portion of the metal wiring is electrically coupled to one or more semiconductor devices included in a logic circuit, and the embedded quadruple-wall capacitor is an embedded dynamic random access memory (eDRAM) capacitor. In one embodiment, the quadruple arrangement of metal plates is electrically coupled to an underlying transistor disposed above the substrate through a floor metal layer disposed below the one or more of the dielectric layers. The transistor is included in a dynamic random access memory (DRAM) circuit.

What is claimed is:

1. An embedded quadruple-wall capacitor for a semiconductor device, the capacitor comprising:
   a trench disposed in a first dielectric layer disposed above a substrate, the trench having a bottom and sidewalls;
   a quadruple arrangement of metal plates disposed at the bottom of the trench, spaced apart from the sidewalls;
   a second dielectric layer disposed on and conformal with the sidewalls of the trench and the quadruple arrangement of metal plates; and
   a top metal plate layer disposed on and conformal with the second dielectric layer.

2. The capacitor of claim 1, wherein the quadruple arrangement of metal plates is electrically coupled, through a floor metal layer disposed below the first dielectric layer, to an underlying transistor disposed above the substrate, the transistor included in a dynamic random access memory (DRAM) circuit.

3. The capacitor of claim 2, further comprising:
   a conductive protection layer disposed directly between the quadruple arrangement of metal plates and the floor metal layer.

4. The capacitor of claim 3, wherein the quadruple arrangement of metal plates and the top metal plate layer comprise a material selected from the group consisting of titanium nitride, tantalum nitride, titanium, tantalum and ruthenium, the floor metal layer comprises copper, and the conductive protection layer comprises a material selected from the group consisting of cobalt, tantalum, tantalum nitride, titanium, tantalum, and ruthenium.

5. The capacitor of claim 1, wherein the top metal plate layer comprises a first conductive layer and a conductive trench-fill layer.

6. The capacitor of claim 5, wherein the first conductive layer comprises titanium nitride, and the conductive trench-fill layer comprises copper.

7. The capacitor of claim 1, wherein the first dielectric layer is a low-K dielectric layer, and the second dielectric layer is a high-K dielectric layer.

8. A semiconductor structure, comprising:
   a plurality of semiconductor devices disposed in or above a substrate;
   one or more dielectric layers disposed above the plurality of semiconductor devices;
   metal wiring disposed in each of the dielectric layers and electrically coupled to one or more of the semiconductor devices; and
   an embedded quadruple-wall capacitor disposed in one or more of the dielectric layers and adjacent to the metal wiring of the one or more dielectric layers, the capacitor comprising:
   a trench disposed in the one or more of the dielectric layers, the trench having a bottom and sidewalls;
   a quadruple arrangement of metal plates disposed at the bottom of the trench, spaced apart from the sidewalls;
   an insulator layer disposed on and conformal with the sidewalls of the trench and the quadruple arrangement of metal plates; and
   a top metal plate layer disposed on and conformal with the insulator layer.

9. The semiconductor structure of claim 8, wherein at least a portion of the metal wiring is electrically coupled to one or more semiconductor devices included in a logic circuit, and wherein the embedded quadruple-wall capacitor is an embedded dynamic random access memory (eDRAM) capacitor.

10. The semiconductor structure of claim 8, wherein the embedded quadruple-wall capacitor is disposed in only one of the dielectric layers.

11. The semiconductor structure of claim 8, wherein the embedded quadruple-wall capacitor is disposed in only two of the dielectric layers, adjacent to the metal wiring of each of the two dielectric layers and also adjacent to a via coupling the metal wiring of each of the two dielectric layers.

12. The semiconductor structure of claim 8, wherein the embedded quadruple-wall capacitor is disposed in more than two of the dielectric layers, adjacent to the metal wiring of all of the more than two dielectric layers.

13. The semiconductor structure of claim 8, wherein the sidewalls of the trench comprise a vertical or near-vertical profile.

14. The semiconductor structure of claim 8, wherein the sidewalls of the trench taper outward starting from the bottom of the trench.

15. The semiconductor structure of claim 8, wherein the quadruple arrangement of metal plates is electrically coupled, through a floor metal layer disposed below the one or more of the dielectric layers, to an underlying transistor disposed above the substrate, the transistor included in a dynamic random access memory (DRAM) circuit.

* * * * *